United States Patent
Parker et al.

(10) Patent No.: US 10,414,435 B1
(45) Date of Patent: Sep. 17, 2019

(54) APPARATUS AND METHOD FOR ATTENUATING VIBRATION TRANSMISSION

(71) Applicants: Alan Dale Parker, Rancho Palos Verdes, CA (US); Timothy C. Cummings, Torrance, CA (US)

(72) Inventors: Alan Dale Parker, Rancho Palos Verdes, CA (US); Timothy C. Cummings, Torrance, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 205 days.

(21) Appl. No.: 15/637,074

(22) Filed: Jun. 29, 2017

(51) Int. Cl.
| | |
|---|---|
| *B62D 7/22* | (2006.01) |
| *H01L 41/04* | (2006.01) |
| *H01L 41/09* | (2006.01) |
| *H01L 41/113* | (2006.01) |

(52) U.S. Cl.
CPC .............. *B62D 7/22* (2013.01); *H01L 41/042* (2013.01); *H01L 41/0986* (2013.01); *H01L 41/1132* (2013.01); *B60Y 2306/09* (2013.01); *B60Y 2400/48* (2013.01)

(58) Field of Classification Search
CPC ........ B62D 7/22; B62D 5/008; B62D 5/0406; B62D 5/0463; H01L 41/042; H01L 41/1132; F16F 15/005; G06F 3/016
See application file for complete search history.

(56) References Cited

U.S. PATENT DOCUMENTS

| | | | | |
|---|---|---|---|---|
| 5,765,817 A | * | 6/1998 | Breitbach | F16F 1/3605 188/267 |
| 6,161,664 A | * | 12/2000 | Brevart | F16B 5/025 188/379 |
| 6,773,197 B2 | * | 8/2004 | Urbach | B60G 7/005 403/135 |
| 2003/0168295 A1 | * | 9/2003 | Han | F16F 15/005 188/267.1 |
| 2004/0130081 A1 | | 7/2004 | Hein et al. | |
| 2005/0173915 A1 | | 8/2005 | Stich | |
| 2012/0204550 A1 | * | 8/2012 | Al-Bender | F16F 15/005 60/420 |

* cited by examiner

*Primary Examiner* — Faye M Fleming
(74) *Attorney, Agent, or Firm* — Tarolli, Sundheim, Covell & Tummino LLP

(57) ABSTRACT

An apparatus for attenuating vibration transmission between first and second structures includes a rod extending entirely through, and being mechanically connected to, both of the first and second structures. The rod defines a central longitudinal axis. A piezoelectric sensor senses vibrations in at least one of the first and second structures and responsively generates a voltage. The piezoelectric sensor is disposed entirely longitudinally between the first and second structures. A piezoelectric actuator actively attenuates the vibrations sensed by the piezoelectric sensor. The piezoelectric actuator is at least partially driven responsive to voltage generated by the piezoelectric sensor. The piezoelectric actuator is disposed entirely longitudinally between the first and second structures. At least one of the piezoelectric sensor and the piezoelectric actuator has a throughhole through which the rod entirely extends.

20 Claims, 4 Drawing Sheets

APPARATUS AND METHOD FOR ATTENUATING VIBRATION TRANSMISSION

TECHNICAL FIELD

This disclosure relates to an apparatus and method for attenuating vibration transmission and, more particularly, to a steering gear system including an apparatus and method for attenuating vibration transmission.

BACKGROUND

Automotive manufacturers are increasingly eliminating rubber bushings historically used at mounting locations for steering gears. This creates a stiffer driving system with enhanced steering response, but has the undesired consequence of increasing effectiveness of transmitting vibration (and noise) through the mounts. The vibration/noise characteristics are typically not known until late in the design process, and modifications to minimize structural vibration in the gear or mounting frame are expensive and may cause delays in production launch.

SUMMARY

In an embodiment, an apparatus for attenuating vibration transmission between first and second structures is provided. A rod extends entirely through, and is mechanically connected to, both of the first and second structures. The rod defines a central longitudinal axis. A piezoelectric sensor senses vibrations in at least one of the first and second structures and responsively generates a voltage. The piezoelectric sensor is disposed entirely longitudinally between the first and second structures. A piezoelectric actuator actively attenuates the vibrations sensed by the piezoelectric sensor. The piezoelectric actuator is at least partially driven responsive to voltage generated by the piezoelectric sensor. The piezoelectric actuator is disposed entirely longitudinally between the first and second structures. At least one of the piezoelectric sensor and the piezoelectric actuator has a throughhole through which the rod entirely extends.

In an embodiment, a method of attenuating vibration transmission between first and second structures with a piezoelectric sensor and a piezoelectric actuator disposed entirely longitudinally between the first and second structures is provided. A rod extends entirely through, and is mechanically connected to, both of the first and second structures. The rod defines a central longitudinal axis. At least one of the piezoelectric sensor and the piezoelectric actuator has a throughhole through which the rod entirely extends. Vibrations are sensed in at least one of the first and second structures. A voltage is generated responsive to the sensed vibrations. The piezoelectric actuator is at least partially driven responsive to the generated voltage. The sensed vibrations are actively attenuated with the piezoelectric actuator.

In an embodiment, a steering gear system is provided. A through bolt secures a steering gear mounting foot to a frame. The throughbolt extends along a central longitudinal axis between a top surface of the steering gear mounting foot and a bottom surface of the frame. A piezoelectric sensor senses vibrations in the steering gear system and responsively generates a voltage. The piezoelectric sensor is disposed longitudinally between the steering gear mounting foot and the frame. A piezoelectric actuator actively attenuates the vibrations in the steering gear system sensed by the piezoelectric sensor. The piezoelectric actuator is at least partially driven responsive to voltage generated by the piezoelectric sensor. The piezoelectric actuator is disposed longitudinally between the steering gear mounting foot and the frame. At least one of the piezoelectric sensor and the piezoelectric actuator has a throughhole through which the throughbolt entirely extends.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Figure 1:
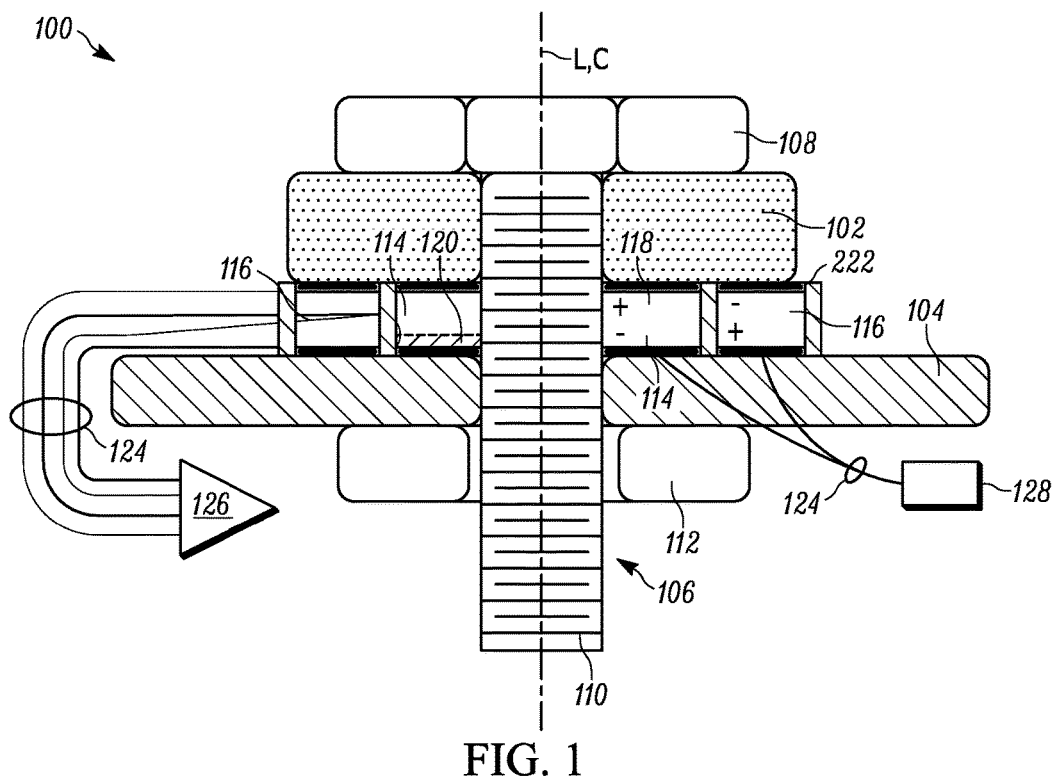
FIG. 1 is a schematic cross-sectional view of one aspect of the invention in an example use environment.

FIG. 1 depicts an apparatus 100 for attenuating vibration transmission between first and second structures 102 and 104, respectively. The apparatus 100 could be useful in many situations in which two structures need to be attached to each other and the relative motion between the two structures needs to be kept to a minimum, such as when the vibration of one structure (whether self-induced or induced by an outside source) may be detrimental if transmitted to the other structure (e.g., increases noise, decreases performance—such as reducing an optical system's ability to maintain line of sight, decreases life, or the like). For example, the apparatus 100 could be used in an engine mount, suspension in race cars, industrial machinery, aircraft, or any other desired use environment. Here, for the sake of description, the apparatus 100 will be shown and described as being used in a steering gear system use environment, where the first structure 102 is a steering gear mounting foot and the second structure 104 is a frame, such as the frame of a vehicle (not shown).

A rod 106 extends entirely through, and is mechanically connected to, both of the first and second structures 102 and 104. For example, when the apparatus 100 is used in a steering gear system, the rod 106 can be a throughbolt, including a head 108 and a shaft 110, which may be threaded, as shown in the Figures. Optionally, a nut or washer 112 can be provided to help hold the throughbolt or rod 106 in place (e.g., via a threaded connection with the throughbolt or rod 106), which may assist with securing the first and second structures 102 and 104 together in a desired manner. When the rod 106 is a throughbolt, for example, the throughbolt can extend between a top surface of the steering gear mounting foot (first structure 102) and a bottom surface of the frame (second structure 104), as shown in FIG. 1. The rod 106 defines a central longitudinal axis L, with a "longitudinal" direction, as used herein, being substantially parallel to the central longitudinal axis L, or in the "up and down" direction, in the orientation of FIG. 1.

At least one piezoelectric (a.k.a. "PZT") sensor 114 is provided for sensing vibrations in at least one of the first and second structures 102 and 104 and responsively generating a voltage. The piezoelectric sensor 114 may be disposed entirely longitudinally between the first and second structures 102 and 104, as shown in FIG. 1. The phrase "disposed entirely longitudinally between" is used herein to indicate that no part of the piezoelectric sensor 114 is located further "outboard" (that is, toward the top or bottom of FIG. 1) then the lowermost surface of the first structure 102 or the uppermost surface of the second structure 104, in the orientation of FIG. 1.

At least one piezoelectric actuator 116 is provided for actively attenuating the vibrations sensed by the piezoelectric sensor 114. The piezoelectric actuator 116 is at least partially driven responsive to voltage generated by the piezoelectric sensor 114. The piezoelectric actuator 116, like the piezoelectric sensor 114, may be disposed entirely longitudinally between the first and second structures 102 and 104. However, it is contemplated that one or both of the piezoelectric sensor 114 and the piezoelectric actuator 116 could also extend further from the central longitudinal axis L in a lateral direction than does one or both of the first and second structures 102 and 104 (i.e., extend beyond a footprint of the first or second structure 102 and 104), as desired for a particular use environment. The term "lateral" is used herein to indicate a direction which is within a plane substantially perpendicular to the central longitudinal axis L.

The piezoelectric sensor 114 and the piezoelectric actuator 116 are shown in the Figures, for the sake of description, as including particular orientations of the positive and negative sides thereof. However, it is contemplated that one of ordinary skill in the art could configure an apparatus 100 having any desired positive and negative directional arrangement to sense and compensate for vibration in one or more axes, as desired for a particular use environment. In addition, one of ordinary skill in the art could specify suitable piezoelectric sensors and actuators 114 and 116 for a particular use environment. For example, suitable sensors could include, but are not limited to, Piezoceramic Lateral & Shear Mode (PZT), Piezoceramic Axial Mode (PZT), Piezofilm (PVF2), Resistive Metal Foil Strain Gages, and/or Resistive Wire Strain Gages. Suitable actuators could include, but are not limited to, Piezoceramic Wafers (PZT), Electrostrictive Ceramic Wafers (PMN), Piezoelectric Polymer Film (PVF2), and/or Shape Memory Metal (e.g., NiTiNol)

At least one of the piezoelectric sensor 114 and the piezoelectric actuator 116 may have a throughhole 118 through which the rod 106 entirely extends. As shown in the Figures, the piezoelectric sensor 114 and the piezoelectric actuator 116 share a common throughhole 118 through a central portion thereof. This is particularly apparent from the plan view of the apparatus 100 shown in FIG. 2, wherein the annular nature of the depicted piezoelectric sensor 114 and piezoelectric actuator 116 is apparent.

Figure 2:
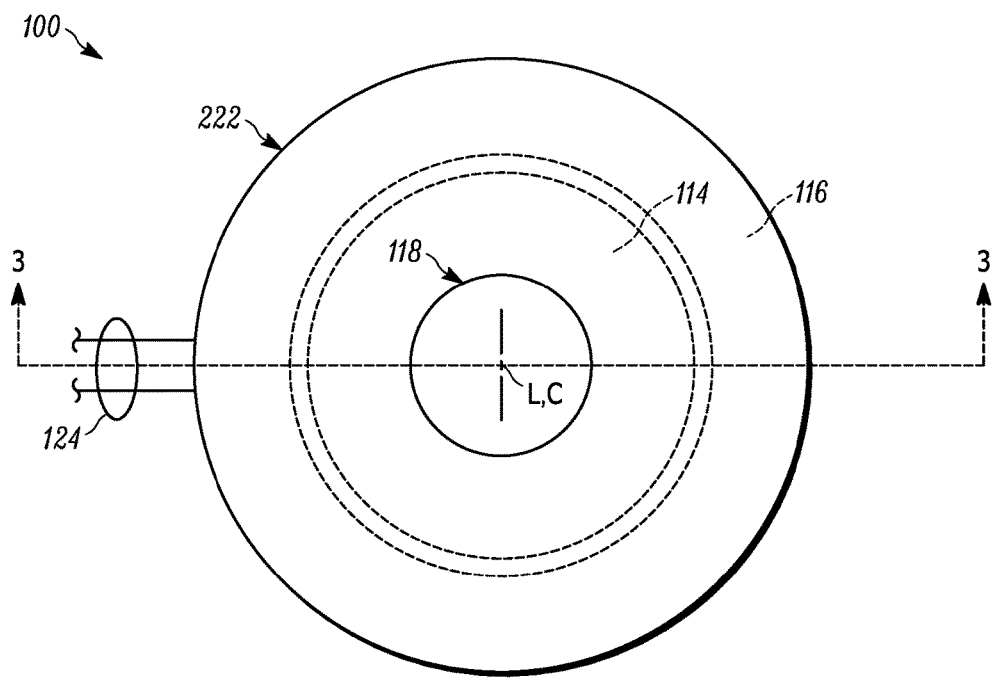
FIG. 2 is a schematic plan view of a component of the aspect of FIG. 1.

Also as shown in FIGS. 1 and 2, at least one of the piezoelectric sensor 114 and the piezoelectric actuator 116 may have a central PZT axis C which coextends with the central longitudinal axis L. Indeed, one or both of the piezoelectric sensor 114 and the piezoelectric actuator 116 may be substantially concentric with the central longitudinal axis C. The term "concentric" is used herein to indicate a common central axis for the piezoelectric sensor 114 and/or the piezoelectric actuator 116 with the central longitudinal axis C.

Figure 3:
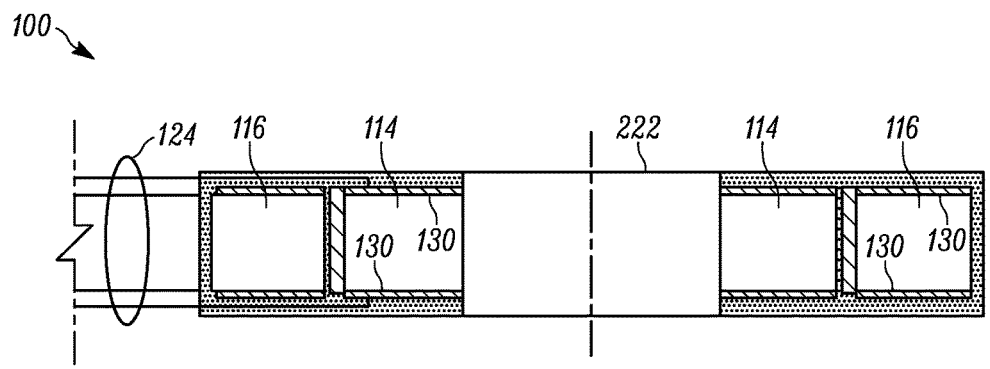
FIG. 3 is a cross-sectional view taken along line 3-3 of FIG. 2.
Figure 4:
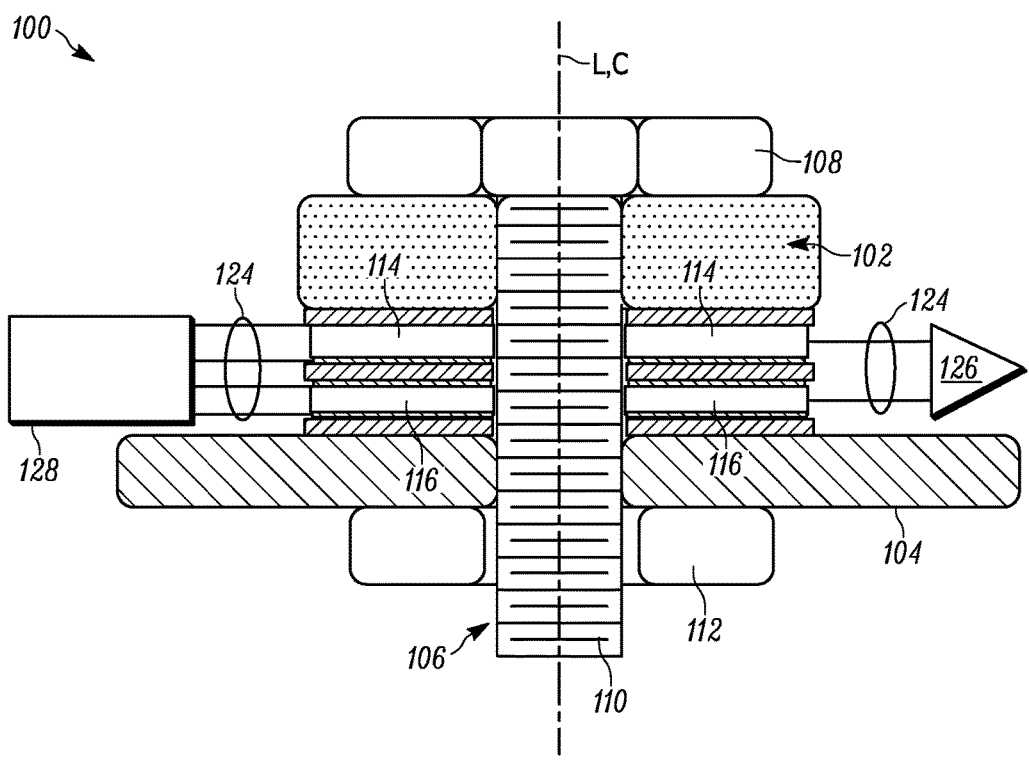
FIG. 4 is a schematic cross-sectional view of an alternate configuration of the aspect of FIG. 1 in the example use environment.
Figure 5:
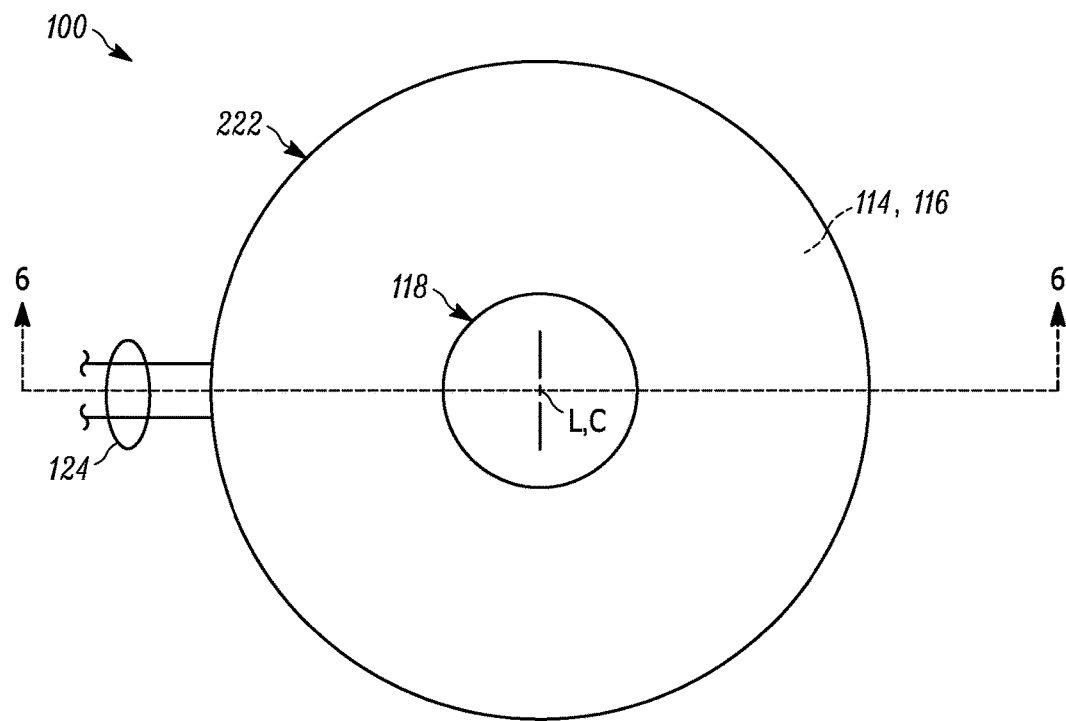
FIG. 5 is a schematic plan view of a component of the aspect of FIG. 4.
Figure 6:
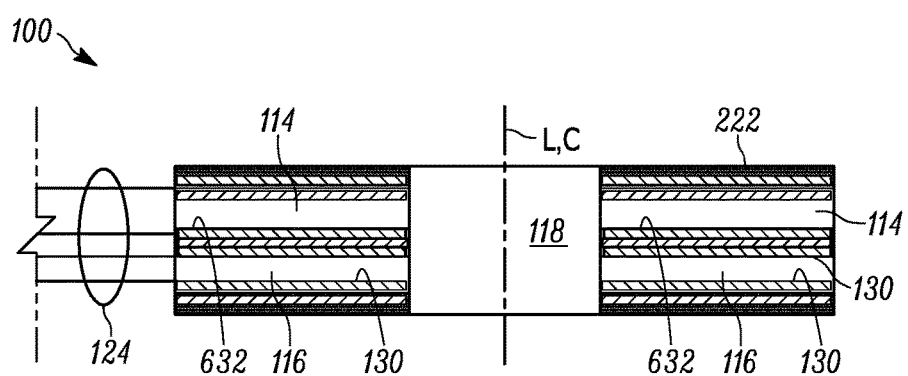
FIG. 6 is a cross-sectional view taken along line 6-6 of FIG. 5.

One of the piezoelectric sensor 114 and the piezoelectric actuator 116 may be located laterally between the rod 106 and the other of the piezoelectric sensor 114 and the piezoelectric actuator 116. For example, as shown in the configuration of the apparatus 100 depicted in FIGS. 1-3, the piezoelectric sensor 114 is located laterally between the rod 106 and the piezoelectric actuator 116. This may be desirable, for example, where the piezoelectric actuator 116 is configured to have a larger surface area than the piezoelectric sensor 114. An alternative configuration of the apparatus 100, wherein the piezoelectric sensor 114 and piezoelectric actuator 116 are both located adjacent the rod 106, is shown in FIGS. 4-6, and will be described below.

One of the piezoelectric sensor 114 and the piezoelectric actuator 116 may have a first longitudinal height, and the other of the piezoelectric sensor 114 and the piezoelectric actuator 116 may have a second longitudinal height that is less than the first longitudinal height. This situation is shown schematically, for example, on the left side of the apparatus 100 in FIG. 1. As represented by the shaded area, the piezoelectric sensor 114 is shorter than the piezoelectric actuator 116. In this case, a spacing shim 120, having a longitudinal height that is substantially similar to the difference between the first and second longitudinal heights, is associated with the other of the piezoelectric sensor 114 and the piezoelectric actuator 116 (here, the piezoelectric sensor 114). When present, the spacing shim 120 may help to "equalize" height differences between the piezoelectric sensor 114 and the piezoelectric actuator 116 as desired. For example, in the configuration of the apparatus 100 shown in FIGS. 1-3, having the piezoelectric sensor 114 and the piezoelectric actuator 116 being different heights may result in an undesirably staggered apparatus 100 profile, taken in the longitudinal direction, whereas use of the spacing shim 120 could help to present a common-height apparatus 100 that may assist with providing a desired mechanical connection between the first and second structures 102 at 104.

The piezoelectric sensor 114 and the piezoelectric actuator 116 may be collectively encapsulated by an outer casing 222. When present, the outer casing 222 may help protect against harsh environments and/or simplify assembly of the apparatus 100. The outer casing 222 could be a film or liquid-applied material that flexibly fits to the contours of the remaining portions of the apparatus 100, or could be a more rigid housing, as desired. For many use environments, such as an automotive steering gear system, the outer casing 222 may be resistant, if not actually impervious, to salt and/or water or other fluid damage. It is also contemplated that the outer casing 222, when present, may be desirably non-electrically conductive and be capable of mechanically withstanding the relatively high compression loads that can develop between the first and second structures 102 and 104.

The apparatus 100 could include control electronics electrically interposed between the piezoelectric sensor 114 and the piezoelectric actuator 116. The control electronics could modify the voltage generated by the piezoelectric sensor 112, and the piezoelectric actuator 116 could be at least partially driven responsive to the modified voltage. For example, the control electronics could include an amplifier. The piezoelectric sensor 114 voltage may be processed, conditioned, amplified, or otherwise treated to drive the piezoelectric actuator 116, either directly or by serving as input to a control system which itself directly drives the piezoelectric actuator 116.

As shown schematically in FIGS. 1 and 4, the piezoelectric sensor 114 and piezoelectric actuator 116 could both be electrically connected, such as via wires 124 or any other desired connection type, to an amplifier 126 and/or any other desired components of a control system 128. One of ordinary skill in the art could readily configure a suitable apparatus 100, including appropriate control electronics, for a particular use environment. Whether or not an outer casing 222 is provided, insulation (shown schematically at 130 in the Figures), and/or conducting foil, carefully placed, may be helpful in achieving desired electrical and electronic connections among the control electronics, the piezoelectric sensor 114, piezoelectric actuator 116, and/or any other portions of the apparatus 100.

Turning to the alternate configuration previously mentioned, one of the piezoelectric sensor 114 and the piezoelectric actuator 116 may be located longitudinally between the first structure 102 and the other of the piezoelectric sensor 114 and the piezoelectric actuator 116. In other words, as especially shown in FIGS. 4 and 6, the piezoelectric sensor 114 and piezoelectric actuator 116 may both be annular and include a through hole 118 and similar features and arrangements in the previously described configuration. Instead of being laterally side-by-side (as above, and in FIGS. 1-3), though, the apparatus 100 as shown in FIGS. 4-6 may be longitudinally "stacked". This arrangement may be desirable, for example, if the piezoelectric sensor 114 and the piezoelectric actuator 116 are different heights, but the use of a spacing shim 120 is not desired. The piezoelectric sensor 114 and the piezoelectric actuator 116 may be different heights for any desired reason, such as, but not limited to, "tuning" of these components by adjusting the relative volumes of the components. Any desired number and arrangement of co-located ("stacked") and/or non-co-located ("concentric") sensor/actuator 114/116 component sets may be provided as desired for a particular use environment. As particularly shown in FIG. 6, insulation 130 and/or conducting foil 632 may be provided and arranged as desired to prevent unwanted electrical conduction between the piezoelectric sensor 114 in the piezoelectric actuator 116.

As shown in the Figures, it is contemplated that, for particular use environments, neither the piezoelectric sensor 114 nor the piezoelectric actuator 116 need be directly mechanically connected to the rod 106. Stated differently, the apparatus 100, or components thereof, could be spaced apart (with or without an intervening physical structure) from the rod 106. In this manner, mechanical isolation of the apparatus 100 from the rod 106 can be readily achieved, for any desired reason (e.g., flexibility in packaging; providing ease of assembly or installation of the apparatus 100, such as by being retrofitted to existing bolted interfaces; and/or providing further mechanical isolation and vibration attenuation from motion of the first and second structures 102 and 104.

Using either configuration of the apparatus 100 as shown in FIGS. 1-6, or any other suitable configuration as provided by one of ordinary skill in the art, vibration transmission between first and second structures 102 and 104 can be attenuated or reduced, if not entirely cancelled. This can be done by providing the interface between the first and second structures 102 and 104 with an apparatus 100. For example, when the first structure 102 is a steering gear mounting foot, the rod 106 could be a throughbolt securing the steering gear mounting foot to a frame, as the second structure 104. Normally, vibrations or other forces produced by one of the first and second structures 102 and 104 would be transmitted to the other of the first and second structures 102 and 104, resulting in unwanted noise, mechanical wear, or the like. However, the apparatus 100 could be used to attenuate this vibration transmission. In a steering gear system use environment, the apparatus 100 could be helpful in reducing transmission of steering gear noise, vibration and harshness while at the same time maintaining high levels of steering responsiveness not achievable with traditional bushing mounts.

Figure 7:
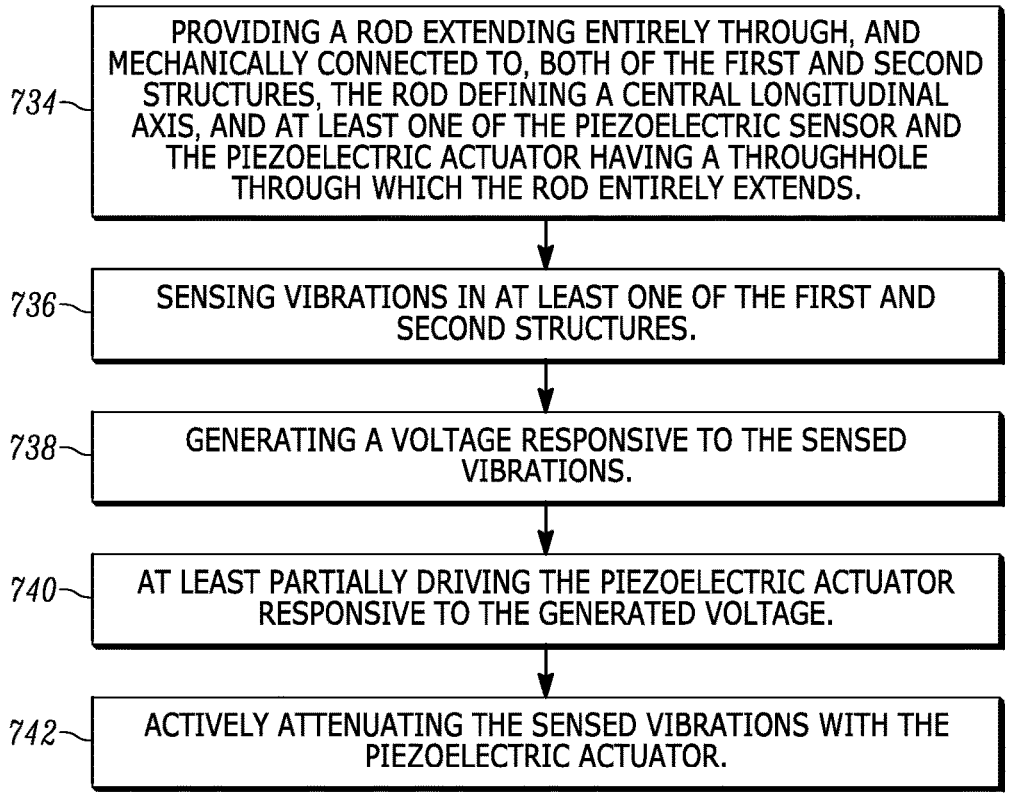
FIG. 7 is a flowchart illustrating an example sequence of operation of the aspect of FIG. 1.

FIG. 7 is a flowchart depicting an example sequence or method of use of the apparatus 100 of any of FIGS. 1-6. Initially, in first action block 734, a rod 106 extending entirely through, and mechanically connected to, both of the first and second structures 102 and 104 is provided. The rod defines a central longitudinal axis C. At least one of the piezoelectric sensor 114 and the piezoelectric actuator 116 has a throughhole 118 through which the rod 106 entirely extends. In other words, the apparatus 100 is set up and configured with respect to the first and second structures 102 and 104, either or both of which may be vibrating relative to the other. The apparatus 100 can then be used, such as via the method described and shown herein, to attenuate this vibrations and therefore help prevent adverse vibrational effects upon the first and second structures 102 and 104 themselves, or even upon a larger structure (e.g., a vehicle or industrial machine) associated with those first and second structures. The apparatus 100 provides a compact and relatively low-cost solution which could be especially effective for broadband frequency isolation above 20 Hz (e.g., 20-2000 Hz), but could be configured by one of ordinary skill in the art for any desired use environment.

In second action block 736, vibrations in at least one of the first and second structures 102 and 104 are sensed. For example in most use applications, they will be sensed with the piezoelectric sensor 114. The method then proceeds to third action block 738 where a voltage is generated responsive to the sensed vibrations; again, this will often be accomplished at least partially by the piezoelectric sensor 114. In fourth action block 740, the piezoelectric actuator 116 is at least partially driven responsive to the generated voltage. It is contemplated that control and/or power electronics, such as, but not limited to, the amplifier 126 and control system 128 previously mentioned could contribute to the generation of the voltage, driving of the piezoelectric actuator 116, or any other tasks or actions related to operation of the apparatus 100.

The method then proceeds to fifth action block 742, where the sensed vibrations are actively attenuated with the piezoelectric actuator 116. As described in the method of FIG. 7, the apparatus 100 could be thought of as operating similarly to the commonly known "noise canceling headphones", in that a vibration is generated with the piezoelectric actuator 116 in order to "cancel out" vibrations in the system that are detected by the piezoelectric sensor 114.

As previously mentioned, control and/or power electronics could be used in a method including the apparatus 100, such as by modifying the generated voltage with control electronics to produce a modified voltage. One example of a modified voltage is a sensed voltage which is passed through an amplifier 126. The piezoelectric actuator 116 can then be at least partially driven responsive to the modified voltage, when present. That is, the output voltage is a function of the strain inside the piezoelectric sensor 114, which is a function of displacement. For most use environments, it will be desirable to achieve substantially the same displacement in the piezoelectric actuator 116. The required voltage to achieve the desired level of displacement (strain) in the piezoelectric actuator 116 will at least partially be based on geometry and external forces acting on the piezoelectric actuator 116. The piezoelectric sensor 114 signal(s) may be conditioned to compensate vibration response and provide desired driving signal for the piezoelectric actuator(s) 116. Examples of signal conditioning schemes include, but are not limited to, Operational Amplifier, Charge Amplifier, Voltage Follower, High Voltage Drive Amplifiers, Phase Compensation, and/or Voltage to Current Converter. Examples of control systems include, but are not limited to, Plant Transfer Function with Feedback Compensation Control, such as Pole-Zero Feedback Compensation, Positive Position Feedback Compensation, and/or Rate Feedback Compensation.

Also as mentioned above, it may be desirable to shield the apparatus, or components thereof, from road debris, salt, liquid splashes, or other potentially detrimental incursions from surrounding space and/or structures. Accordingly, a method for providing and using the apparatus 100 could include avoiding ambient fluid contact by encapsulating both the piezoelectric actuator 116 and the piezoelectric sensor 114 inside an outer casing 222.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus for attenuating vibration transmission between first and second structures, the apparatus comprising:
    a rod extending entirely through, and mechanically connected to, both of the first and second structures, the rod defining a central longitudinal axis;
    a piezoelectric sensor that senses vibrations in at least one of the first and second structures and responsively generates a voltage, the piezoelectric sensor being disposed entirely longitudinally between the first and second structures; and
    a piezoelectric actuator that actively attenuates the vibrations sensed by the piezoelectric sensor, the piezoelectric actuator being at least partially driven responsive to voltage generated by the piezoelectric sensor, the piezoelectric actuator being disposed entirely longitudinally between the first and second structures;
    wherein at least one of the piezoelectric sensor and the piezoelectric actuator has a throughhole in a central portion thereof through which the rod entirely extends.

2. The apparatus of claim 1, wherein at least one of the piezoelectric sensor and the piezoelectric actuator has a central PZT axis which coextends with the central longitudinal axis.

3. The apparatus of claim 1, wherein both the piezoelectric sensor and the piezoelectric actuator are concentric with the central longitudinal axis.

4. The apparatus of claim 1, wherein one of the piezoelectric sensor and the piezoelectric actuator is located laterally between the rod and the other of the piezoelectric sensor and the piezoelectric actuator.

5. The apparatus of claim 4, wherein one of the piezoelectric sensor and the piezoelectric actuator has a first longitudinal height, the other of the piezoelectric sensor and the piezoelectric actuator has a second longitudinal height that is less than the first longitudinal height, and a spacing shim, having a longitudinal height that is substantially similar to the difference between the first and second longitudinal heights, is associated with the other of the piezoelectric sensor and the piezoelectric actuator.

6. The apparatus of claim 4, wherein the piezoelectric sensor and the piezoelectric actuator are collectively encapsulated by an outer casing.

7. The apparatus of claim 1, wherein one of the piezoelectric sensor and the piezoelectric actuator is located longitudinally between the first structure and the other of the piezoelectric sensor and the piezoelectric actuator.

8. The apparatus of claim 7, wherein the piezoelectric sensor and the piezoelectric actuator are collectively encapsulated by an outer casing.

9. The apparatus of claim 1, wherein neither the piezoelectric sensor nor the piezoelectric actuator is directly mechanically connected to the rod.

10. The apparatus of claim 1, including control electronics electrically interposed between the piezoelectric sensor and the piezoelectric actuator, the control electronics modifying the voltage generated by the piezoelectric sensor, wherein the piezoelectric actuator is at least partially driven responsive to the modified voltage.

11. The apparatus of claim 1, wherein the control electronics includes an amplifier.

12. A method of attenuating vibration transmission between first and second structures with a piezoelectric sensor and a piezoelectric actuator disposed entirely longitudinally between the first and second structures, the method comprising:

providing a rod extending entirely through, and mechanically connected to, both of the first and second structures, the rod defining a central longitudinal axis, and at least one of the piezoelectric sensor and the piezoelectric actuator having a throughhole in a central portion thereof through which the rod entirely extends;

sensing vibrations in at least one of the first and second structures;

generating a voltage responsive to the sensed vibrations;

at least partially driving the piezoelectric actuator responsive to the generated voltage; and actively attenuating the sensed vibrations with the piezoelectric actuator.

13. The method of claim 12, including:

modifying the generated voltage with control electronics to produce a modified voltage; and at least partially driving the piezoelectric actuator responsive to the modified voltage.

14. The method of claim 12, including avoiding ambient fluid contact by encapsulating both the piezoelectric actuator and the piezoelectric sensor inside an outer casing.

15. A steering gear system, comprising:

a throughbolt securing a steering gear mounting foot to a frame, the throughbolt extending along a central longitudinal axis entirely between a top surface of the steering gear mounting foot and a bottom surface of the frame;

a piezoelectric sensor that senses vibrations in the steering gear system and responsively generates a voltage, the piezoelectric sensor being disposed longitudinally between the steering gear mounting foot and the frame; and a piezoelectric actuator that actively attenuates the vibrations in the steering gear system sensed by the piezoelectric sensor, the piezoelectric actuator being at least partially driven responsive to voltage generated by the piezoelectric sensor, the piezoelectric actuator being disposed longitudinally between the steering gear mounting foot and the frame;

wherein at least one of the piezoelectric sensor and the piezoelectric actuator has a throughhole through which the throughbolt entirely extends.

16. The steering gear system of claim 15, wherein at least one of the piezoelectric sensor and the piezoelectric actuator has a central PZT axis which coextends with the central longitudinal axis.

17. The steering gear system of claim 15, wherein both the piezoelectric sensor and the piezoelectric actuator are concentric with the central longitudinal axis.

18. The steering gear system of claim 15, wherein one of the piezoelectric sensor and the piezoelectric actuator is located laterally between the throughbolt and the other of the piezoelectric sensor and the piezoelectric actuator.

19. The steering gear system of claim 15, wherein the piezoelectric sensor and the piezoelectric actuator are collectively encapsulated by an outer casing.

20. The steering gear system of claim 15, wherein neither the piezoelectric sensor nor the piezoelectric actuator is directly mechanically connected to the throughbolt.

* * * * *